(12) United States Patent
Han

(10) Patent No.: US 6,902,979 B2
(45) Date of Patent: Jun. 7, 2005

(54) METHOD FOR MANUFACTURING MASK ROM

(75) Inventor: Chang Hun Han, Kyoungki-do (KR)

(73) Assignee: DongbuAnam Semiconductor Inc., Seoul (KR)

( * ) Notice: Subject to any disclaimer, the term of this patent is extended or adjusted under 35 U.S.C. 154(b) by 335 days.

(21) Appl. No.: 10/201,860

(22) Filed: Jul. 24, 2002

(65) Prior Publication Data

US 2003/0045079 A1 Mar. 6, 2003

(30) Foreign Application Priority Data

Sep. 5, 2001 (KR) .......................................... 2001-54461

(51) Int. Cl.[7] .......................................... H01L 21/8234
(52) U.S. Cl. ..................................... 438/275; 438/278
(58) Field of Search ............................... 438/262, 263, 438/275, 276, 277, 278, 424, 595; 365/178

(56) References Cited

U.S. PATENT DOCUMENTS

| | | | |
|---|---|---|---|
| 5,453,392 A | 9/1995 | Hong et al. | |
| 6,057,195 A | 5/2000 | Wu | |
| 6,122,188 A * | 9/2000 | Kim et al. | 365/103 |
| 6,165,850 A * | 12/2000 | Wu | 438/275 |
| 6,204,127 B1 * | 3/2001 | Wang | 438/270 |
| 6,252,797 B1 | 6/2001 | Hasegawa | |
| 6,420,237 B1 * | 7/2002 | Chang | 438/300 |
| 6,461,949 B1 * | 10/2002 | Chang et al. | 438/585 |
| 6,518,131 B1 * | 2/2003 | Lim | 438/275 |
| 6,709,933 B2 * | 3/2004 | Kim | 438/275 |

* cited by examiner

Primary Examiner—Matthew Smith
Assistant Examiner—Lex H. Malsawma
(74) Attorney, Agent, or Firm—Timothy J. Keefer; Seyfarth Shaw LLP

(57) ABSTRACT

A method for manufacturing a mask ROM of flat cell structure. The method includes the steps of: providing a semiconductor substrate having a flat cell array region and a peripheral circuit region; forming a first and a second mask patterns exposing a substrate portions corresponding to a diffusion layer formation region of the flat cell array region and a device isolation layer of the peripheral circuit region; ion-implanting an impurity in the exposed substrate portions; forming a trench by etching the exposed substrate portion peripheral circuit region; forming a linear oxide layer on the first and the second mask patterns and the surface of the trench, a diffusion layer on the flat cell array region, and a barrier oxide layer on the surface of diffusion layer in accordance with a thermal oxidation process; depositing an oxide layer on the linear oxide layer to fill up the trench; polishing the oxide layer to expose the surface of the first and the second mask patterns; and forming a diffusion layer on the flat cell array region and a trench type isolation layer on the peripheral circuit region by removing the first and the second mask patterns.

8 Claims, 11 Drawing Sheets

METHOD FOR MANUFACTURING MASK ROM

BACKGROUND OF THE INVENTION

1. Field of the Invention

The present invention relates to a method for manufacturing a mask ROM and, more particularly, to a method for manufacturing a mask ROM of a flat cell structure.

2. Description of the Related Art

A mask ROM is one of non-volatile devices, which stores necessary information by using mask process. The mask process for may be carried out in device isolation process or metal wiring process, by ion implantation to channel region of memory cell. The ion implantation process generates the threshold voltage difference between ion-implanted cells and the others, thereby determining stored data.

Generally, the mask ROM has a flat cell structure to improve operation speed by increasing cell currents, as shown in FIG. 1.

FIG. 1 is a schematic plan of mask ROM having a conventional flat cell structure, wherein a reference code A is a flat cell array region, B is a peripheral circuit region, 10 is an active region, and 20 is a code mask region.

As shown in the drawing, a plurality of BN+ (Buried N+) diffusion layers 12 and word lines 14 are cross-arranged with a predetermined distance in a row direction and a column direction, respectively, on a flat cell array region A. On a peripheral region B, a BN+ diffusion layer 12 is provided and a bit line contact 16 is formed to be in contact with the diffusion layer 12. Here, the BN+ diffusion layer 12 is employed as junctions for bit line and source/drain regions of cell transistor. The word line 14 has the same width as the channel width in memory cell.

According to the mask ROM of flat cell structure thus constructed, in the memory cell array region, isolation of cells is conducted not with a device isolation layer formed by LOCOS or STI process but by a device isolation layer covering a whole memory cell array region. And, source/drain regions of cell transistor are not separated since they comprise BN+ diffusion layers 12, thereby the contact of BN+ diffusion layer 12 is arranged on the peripheral circuit region, not on the memory cell array region.

Therefore, the mask ROM having a flat cell structure can accomplish high integration without contact with a device isolation layer in the memory cell array region.

FIG. 2 is a flow chart showing a method for manufacturing a mask ROM of a flat cell structure according to a conventional art.

As shown in the drawing, a device isolation layer is formed on a semiconductor substrate by a device isolation process S1. A well is formed on the substrate by an ion implantation process for the well formation S2. It is possible to perform the well process S2 prior to the device isolation process S1. A BN+ diffusion layer is formed on the substrate by a BN+ ion implantation process S3. A gate oxide layer and a gate electrode are formed on the substrate by a thermal oxidation process S4 and a conductive layer deposition and etching process 5. A cell isolation is performed by ion implantation process S6. Source/drain is formed by a high concentration ion implantation process S7.

Although it is not shown in the drawings, data coding is performed in accordance with ion implantation process using a mask.

FIGS. 3A to 3F are sectional views showing a method for manufacturing a mask ROM of flat cell structure according to a conventional art. The drawing on the left is a sectional view of flat cell array region (A) and one on the right is a sectional view of peripheral circuit region (B).

Referring to FIG. 3A, a first insulating layer 31a, a buffer layer 31b and a second insulating layer 31c are sequentially formed on a semiconductor substrate 30. The first and the second insulating layers 31a, 31c comprise oxide layers and the buffer layer 31b comprises a nitride layer. A first sensitive film 32 is applied on a multi-layered film 31 comprising a laminated layer of the first insulating layer 31a, the buffer layer 31b and the second insulating layer 31c and then, the first sensitive film 32 is exposed and developed to expose the multi-layered film of trench formation region on the peripheral circuit region (B).

Referring to FIG. 3B, the multi-layered film 31 of the exposed peripheral circuit region (B) is etched by using the patterned first sensitive layer 32 as an etching barrier, thereby exposing the substrate corresponding to the trench formation region of peripheral circuit region (B) . A trench 33 is formed by etching the exposed substrate to a predetermined depth.

Referring to FIG. 3C, the first sensitive film is removed. A linear oxide layer 34 is formed on the multi-layered film 31 of flat cell array region (A) and the trench 33 and the multi-layered film 31 of the peripheral circuit region (B) in accordance with a thermal oxidation process. An oxide layer 35 is formed on the linear oxide layer 34 to fill up the trench 33.

Referring to FIG. 3D, the oxide layer is polished to expose the surface of second insulating layer of the multi-layered film in accordance with a CMP (Chemical Mechanical Polishing) process, thereby forming a device isolation layer 35a in a trench type on the peripheral circuit region (B). The second insulating layer and the buffer layer of the multi-layered film are removed.

Referring to FIG. 3E, a third insulating layer 36 is formed on the entire surface of semiconductor substrate 30. A second sensitive film 37 is applied on the third insulating layer and then, exposed and developed to expose the third insulating layer corresponding to BN+ diffusion layer formation region of flat cell array region (A).

Referring to FIG. 3F, the exposed third insulating layer of flat cell array region (A) and the first insulating layer thereunder are etched by using the patterned second sensitive film as an etching barrier, thereby exposing the BN+ diffusion layer formation region of substrate. The second sensitive film is removed. A predetermined conductive impurities are ion-implanted to form a BN+ diffusion layer, thereby forming a BN+ ion implantation region 38 on the surface of the exposed flat cell array region (A). The BN+ ion implantation is conducted by conductive impurities opposite to the substrate, for example, n-type impurities such as P or As in a p-type substrate.

Referring to FIG. 3G, the resulting structure is subjected to annealing process, thereby forming a BN+ diffusion layer 38a by activating ion impurities implanted in the substrate. At the same time, a barrier oxide layer 39 is formed on the surface of the BN+ diffusion layer 38a. The barrier oxide layer 39 is grown to have a thickness sufficient to prevent damage of BN+ diffusion layer 38a and increase of parasitic capacitance between the gate electrode and junctions in a later step. The third insulating layer and the first insulating layer are removed from the flat cell array region (A) and the peripheral circuit region (B), thereby providing a BN+ diffusion layer 38a and a barrier oxide layer 39 on the substrate of flat cell array region (A), and a trench type isolation layer 35a on the substrate of the peripheral circuit region (B).

Although it is not shown in the drawings, a LOGIC process including a gate process is performed on the resulting substrate having the BN+ diffusion layer 38a and the device isolation layer 35a, thereby completing a mask ROM of a flat cell structure.

However, the conventional method has several problems in LOGIC process less than 0.25 μm.

First, it is not needed to perform device isolation of memory cells in a mask ROM of flat cell structure, thereby the whole cell region is active region. Therefore, device isolation process by STI is performed only on the peripheral circuit region and the STI process includes trench fill up of oxide layer and CMP process of the oxide layer. However, there arise problems in that the active region of flat cell array region is larger than that of peripheral circuit region, thereby the oxide layer is underpolished on the flat cell array region and on the peripheral circuit region, the oxide layer is overpolished during the CMP process.

It is possible to overcome the CMP problem by adding a dummy oxide layer pattern on the large active region or adding a mask and etching process to remove the underpolished oxide layer. However, there arises another problem that the degree of integration is lowered due to the added dummy oxide layer pattern and manufacturing time and cost are increased by the additional steps.

Finally, device isolation and BN+ diffusion layer formation are carried out respectively, thereby increasing the number of unit processes to LOGIC process and manufacturing time and cost are also increased.

SUMMARY OF THE INVENTION

Therefore, the present invention has been proposed to solve the above problems and an object of the present invention is to provide a method for manufacturing a mask ROM of a flat cell structure to desirably perform a CMP process on a flat cell array region and a peripheral circuit region.

Another object of the present invention is to provide a method for manufacturing a mask ROM of flat cell structure capable of reducing the number of unit processes to form the BN+ diffusion layer and trench type device isolation layer.

In order to accomplish the above objects, the present invention comprises the steps of: providing a semiconductor substrate having a flat cell array region and a peripheral circuit region; forming a first and a second mask patterns exposing the substrate portions corresponding to a diffusion layer formation region of the flat cell array region and a device isolation layer of the peripheral circuit region; ion-implanting an impurity in the exposed substrate portions; forming a trench by etching the exposed substrate portion of peripheral circuit region; forming a linear oxide layer on the first and the second mask patterns and the surface of the trench, a diffusion layer on the flat cell array region, and a barrier oxide layer on the surface of diffusion layer in accordance with a thermal oxidation process; depositing an oxide layer on the linear oxide layer to fill up the trench; polishing the oxide layer to expose the surface of the first and the second mask patterns; and forming a diffusion layer on the flat cell array region and a trench type isolation layer on the peripheral circuit region by removing the first and the second mask patterns.

The present invention further comprises a step of masking the peripheral circuit region so that the impurity ion implantation is not deeper than the trench, between the step of forming the first and the second mask patterns and the step of performing ion-implantation of a predetermined conductive impurities The present invention further comprises a step of forming a spacer on the sidewalls of first and second mask patterns to reduce the size of diffusion layer, between the step of forming the first and the second mask patterns and the step of performing ion-implantation of a predetermined conductive impurities.

According to the present invention, the first and the second mask patterns comprise multi-layered structure of two or more layers, desirably, a first insulating layer, a buffer layer and a second insulating layer. The step of forming a trench may be carried out after masking the flat cell array region. Moreover, the step of performing ion-implantation of a predetermined conductive impurities is conducted with conductive impurities opposite to the substrate in high concentration and the depth is lower than that of the trench on the peripheral circuit region. The linear oxide layer has a thickness of 50~400 Å.

BRIEF DESCRIPTION OF THE DRAWINGS

The objects and features of the invention may be understood with reference to the following detailed description of an illustrative embodiment of the invention, taken together with the accompanying drawings.

DETAILED DESCRIPTION OF THE INVENTION

Figure 4:
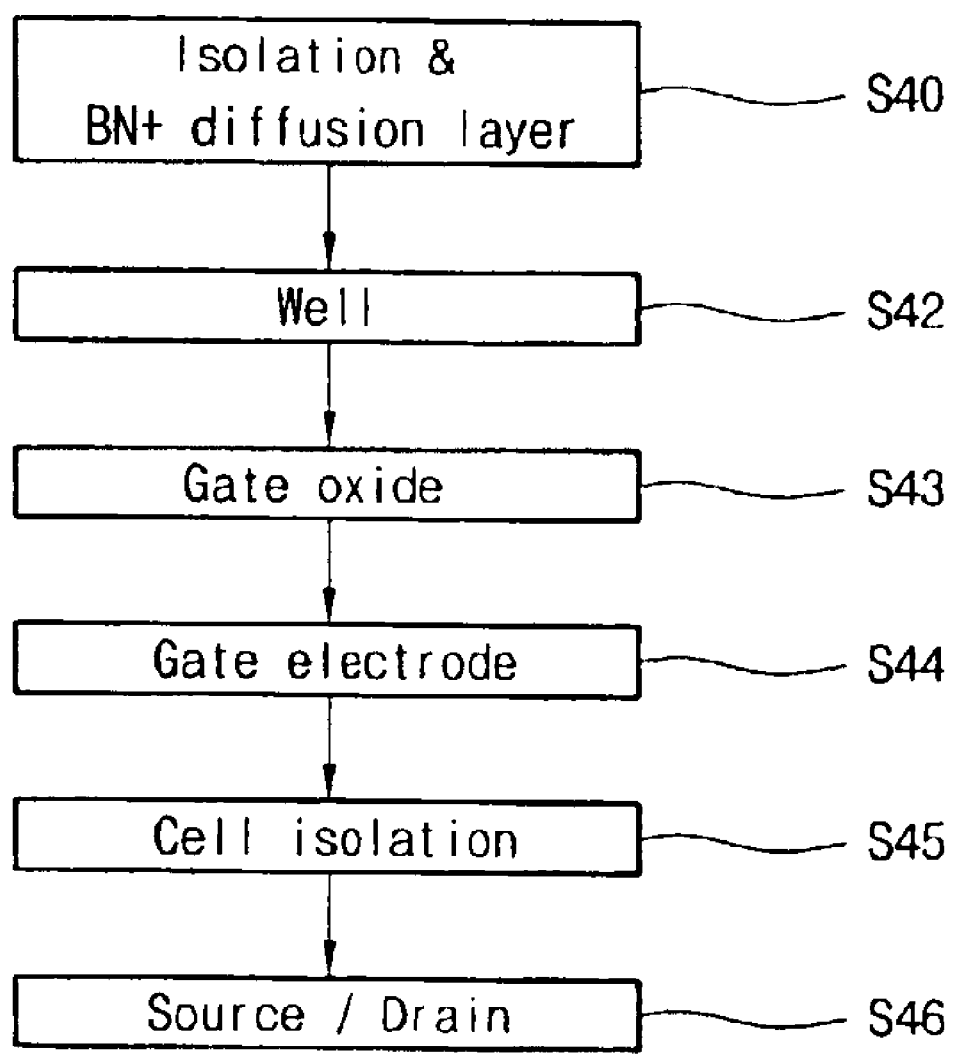
FIG. 4 is a flow chart showing a method for manufacturing a mask ROM of flat cell structure according to the present invention.

FIG. 4 is a flow chart showing a method for manufacturing a mask ROM of flat cell structure according to the present invention.

Figure 1:
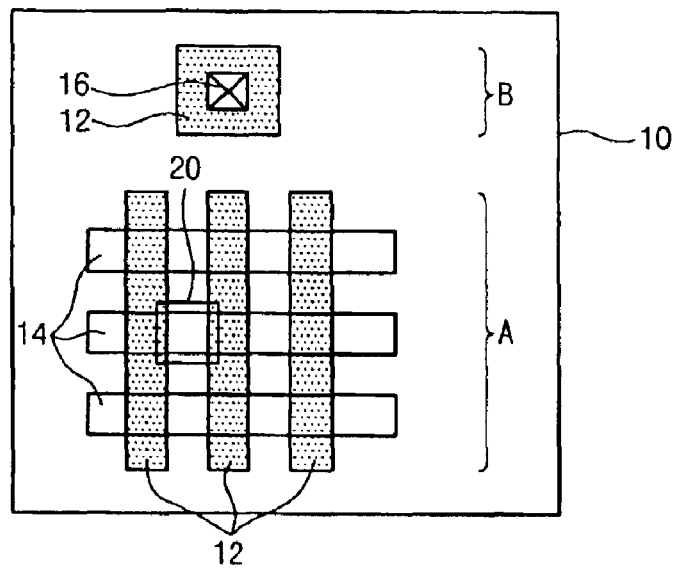
FIG. 1 is a schematic plan showing a mask ROM of flat cell structure according to a conventional method.
Figure 2:
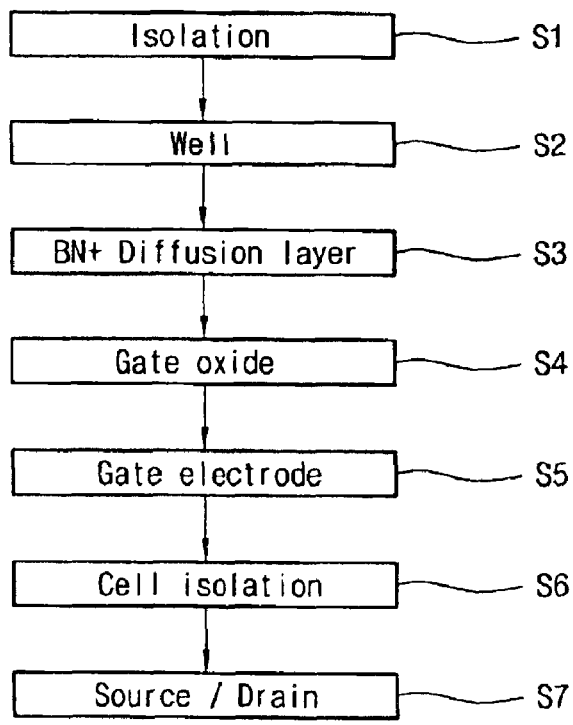
FIG. 2 is a flow chart showing a method for manufacturing a mask ROM of flat cell structure according to a conventional method.
Figure 3A:
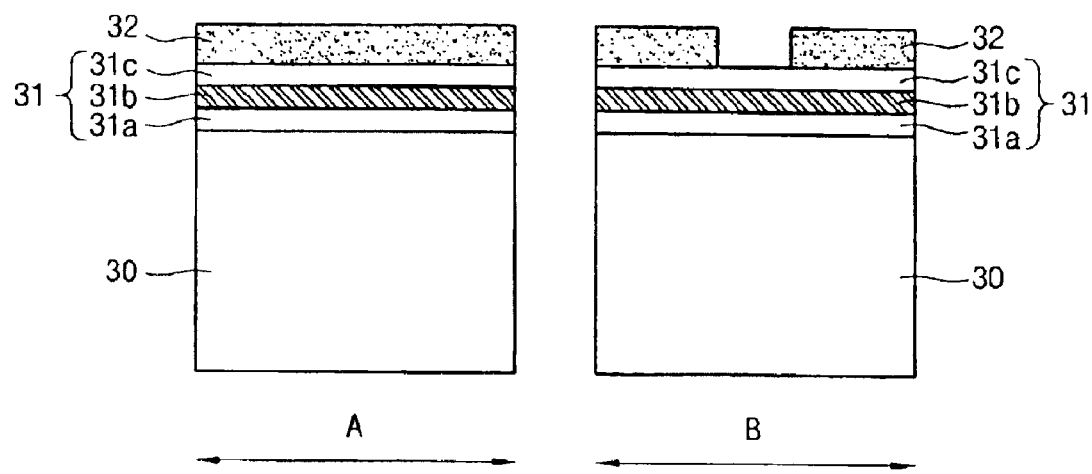
FIGS. 3A to 3G are sectional views showing a method for manufacturing a mask ROM of flat cell structure according to a conventional method.
Figure 3B:
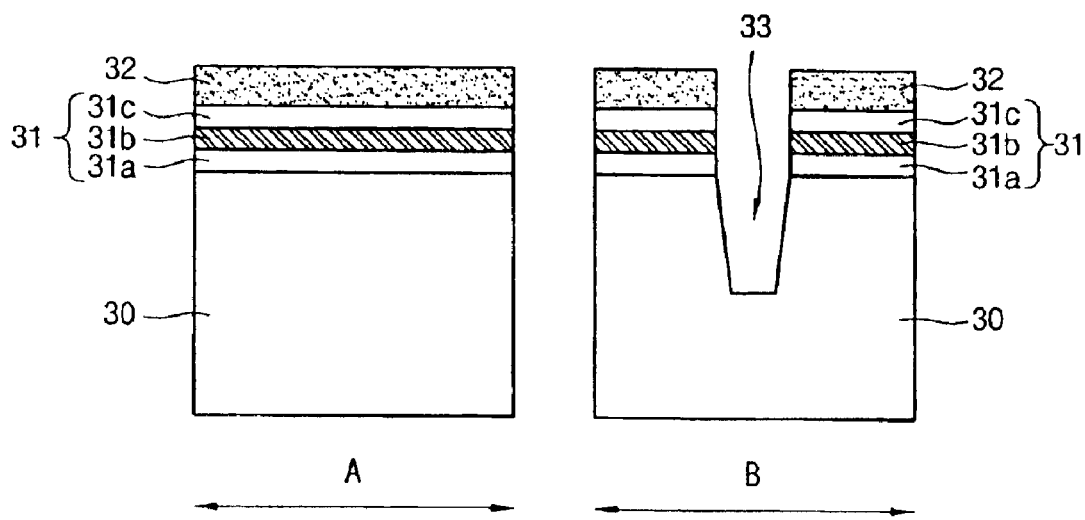
Figure 3C:
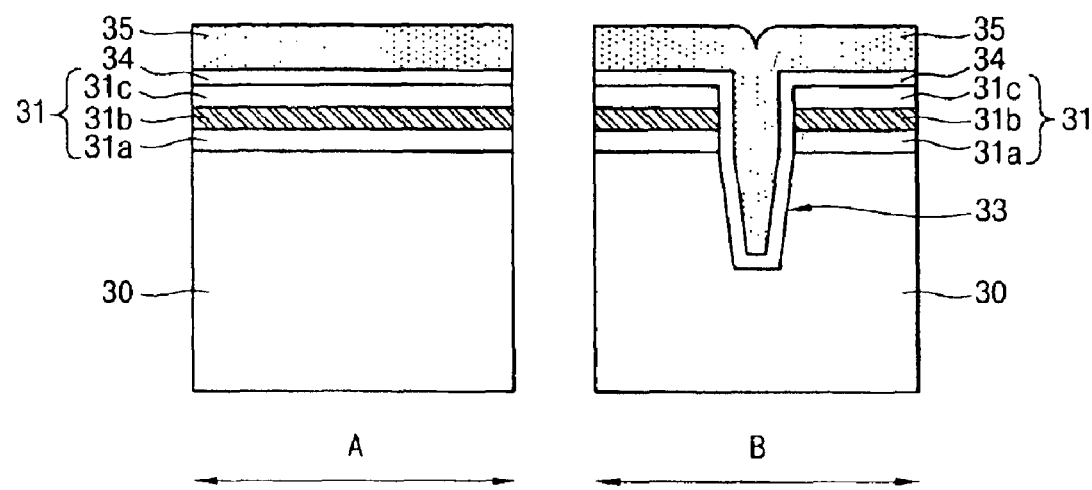
Figure 3D:
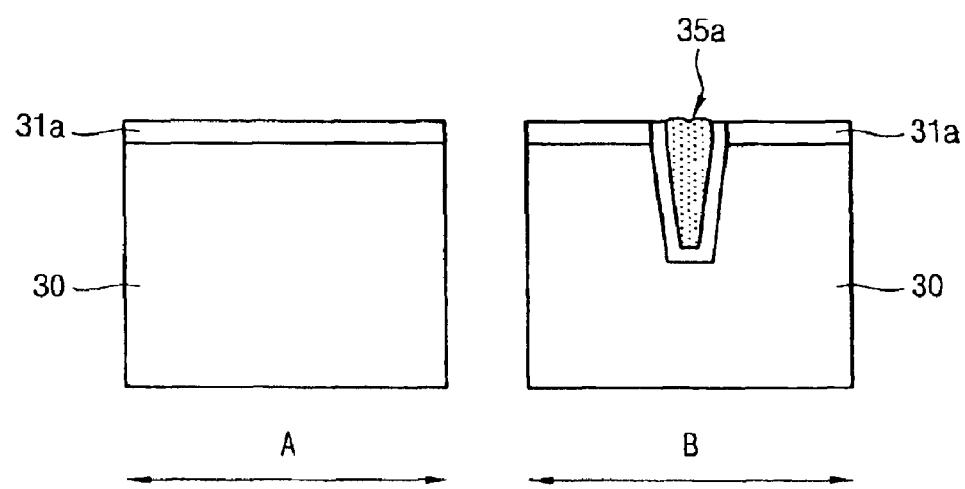
Figure 3E:
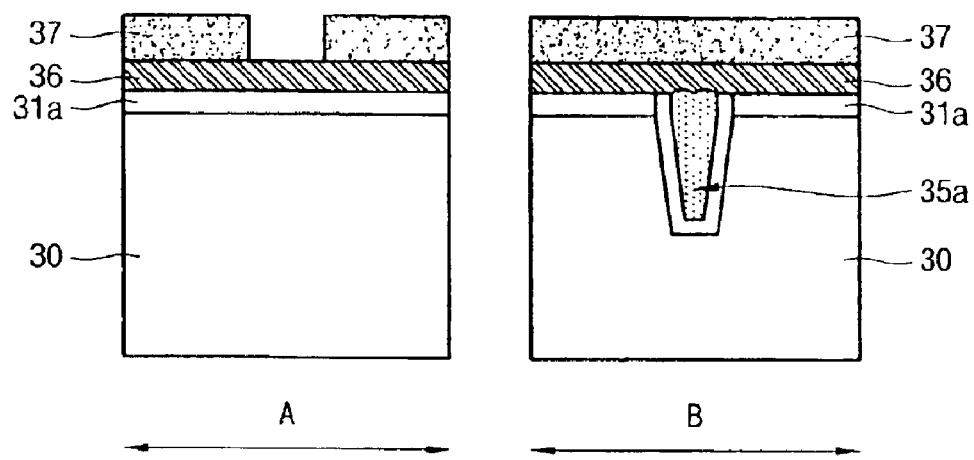
Figure 3F:
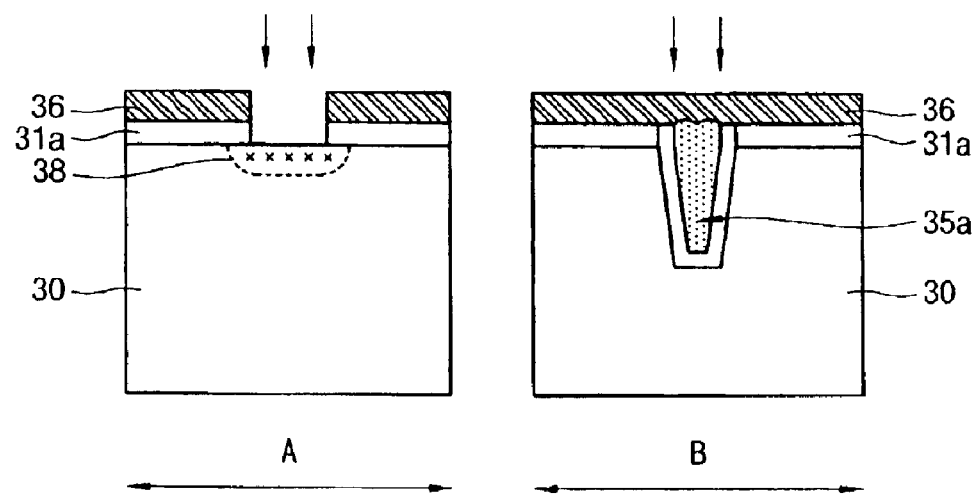
Figure 3G:
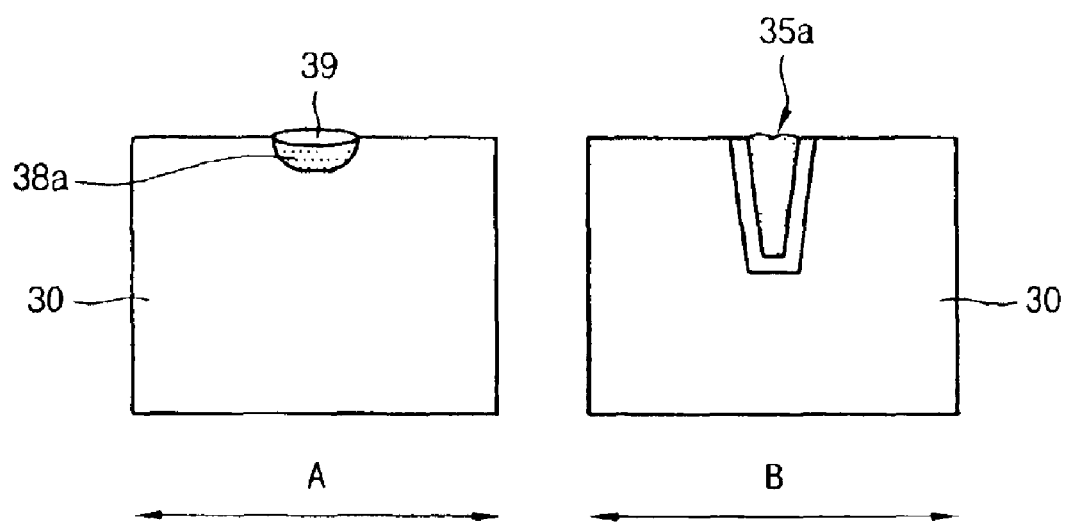

As shown in the drawing, compared with the conventional method of FIG. 2, device isolation process and BN+ diffusion layer formation process S40 are performed at the same time. That is, according to the present invention, STI process on the peripheral circuit region and BN+ diffusion layer formation process on the flat cell array region are performed at the same time. Therefore, it is possible to reduce the number of unit processes and to prevent under polish of oxide layer on the flat cell array region and over polish on the peripheral circuit region in a CMP process.

The other processes are carried out in the same manner to the conventional method. That is, a well process S42, a thermal oxidation process for the formation of a gate oxide layer S43, conductive layer deposition and etching process for the formation of a gate S44, ion implantation process for cell isolation S45 and ion implantation process in high concentration for the formation of source/drain S46 are carried out in the same manner to the conventional method. It is possible to perform the well process S42 prior to device isolation and BN+ diffusion layer formation process S40.

FIGS. 5A to 5G are sectional views showing a method for manufacturing a mask ROM of flat cell structure according to an embodiment of the present invention.

Figure 5A:
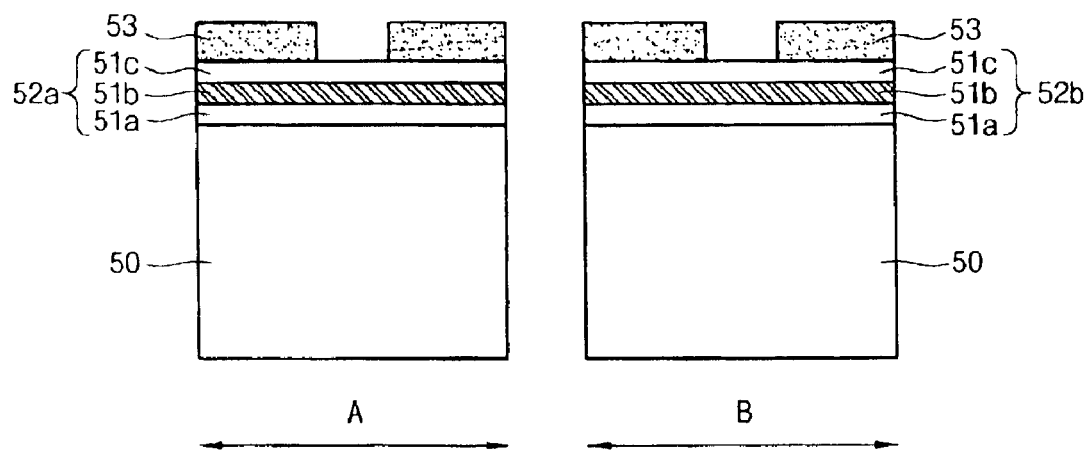
FIGS. 5A to 5G are sectional views showing a method for manufacturing a mask ROM of flat cell structure according to an embodiment of the present invention.

Referring to FIG. 5A, a multi-layered film 52, comprising a first insulating layer 51a, a buffer layer 51b and a second insulating layer 51c, is formed on a semiconductor substrate 50. The first insulating layer 51a is an oxide layer, buffering stress by upper layers. The buffer layer 51b is a nitride layer, controlling the degree of polish in CMP process and protecting the active region in a later oxidation process. The second insulating layer 51c is an oxide layer, serving as an etching barrier in etching the substrate. A first sensitive film 53 is applied on the multi-layered film 52 and then, exposed and developed to expose the multi-layered film corresponding to the BN+ diffusion layer of flat cell array region (A) and the trench formation region of peripheral circuit region (B). The exposure process is performed by a light source over DUV to increase accuracy of pattern.

Figure 5B:
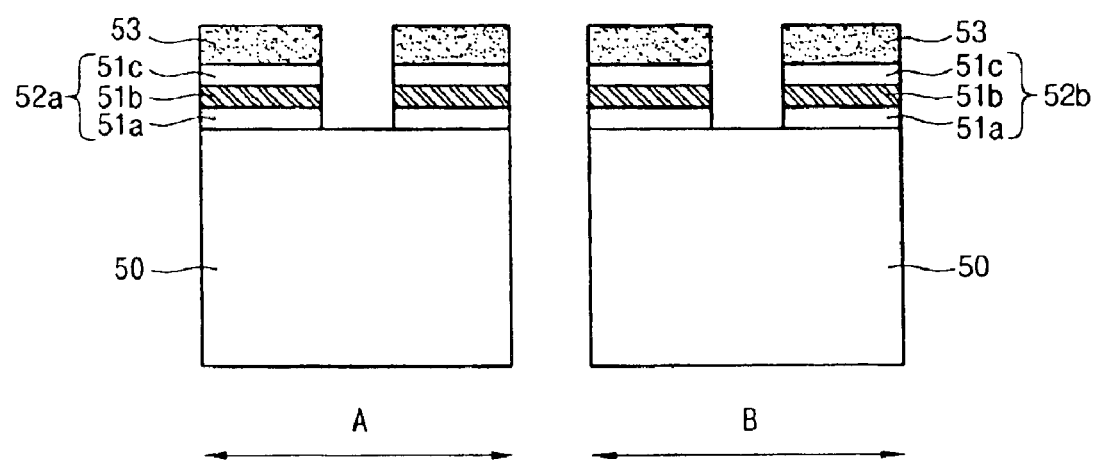

Referring to FIG. 5B, the exposed multi-layered film of flat cell array region (A) and peripheral circuit region (B) are etched by using the patterned first sensitive film 53 as an etching barrier, thereby forming a first mask pattern 52a for the formation of BN+ diffusion layer and a second mask pattern 52b for the formation of trench to expose the BN+ diffusion layer formation region and the trench formation region on the substrate 50.

Figure 5C:
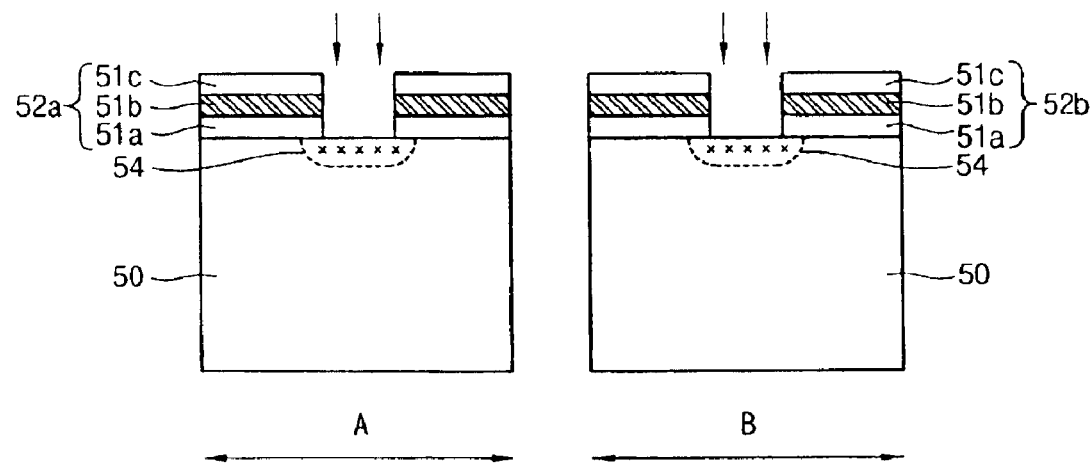

Referring to FIG. 5C, the first sensitive film is removed. Conductive impurities opposite to the substrate 50 are ion-implanted in high concentration in the exposed substrate by using the first and the second mask patterns 52a, 52b as an ion implantation barrier, thereby forming a BN+ ion implantation region 54. The BN+ ion implantation is performed by N type impurities such as P and As when the substrate is a P type. And, the BN+ ion implantation region 54 has a depth not deeper than that of the trench on the peripheral circuit region (B). When the BN+ ion implantation region 54 has a depth deeper than that of the trench due to sufficient ion implantation energy, the BN+ ion implantation is performed after masking the peripheral circuit region (B).

Figure 5D:
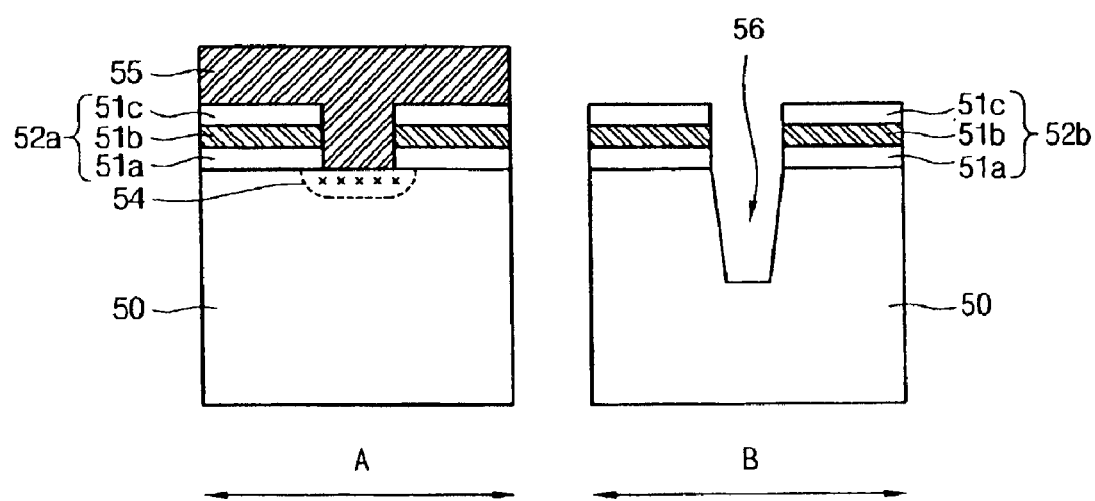

Referring to FIG. 5D, a second sensitive film 55 is applied on the first and the second mask patterns 52i a, 52b and the exposed substrate, then, exposed and developed to remain only on the flat cell array region (A). The exposed substrate of peripheral circuit region (B) is etched to a predetermined depth by using the second mask pattern 52b as an etching barrier, thereby forming a trench 56.

Figure 5E:
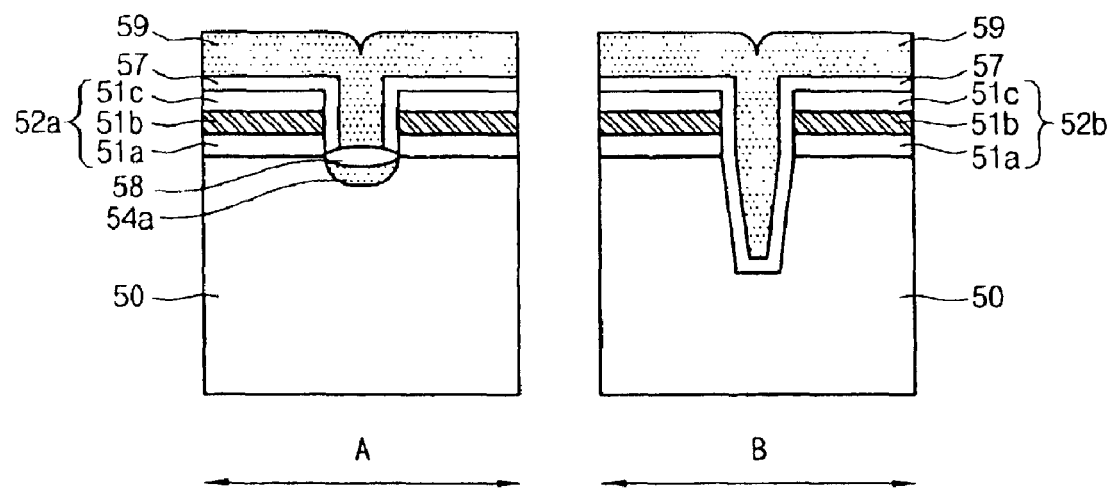

Referring to FIG. 5E, the remaining second sensitive film is removed. The resulting substrate is subjected to thermal oxidation process, thereby activating BN+ ion-implanted impurities to form a BN+ diffusion layer 54a on the flat cell array region (A) and at the same time, a linear oxide layer 57 is formed to have a thickness of 50~400 Å on the surface of the first mask pattern 52a on the flat cell array region (A) and on the trench 56 and the surface of second mask pattern 52b on the peripheral circuit region (B).

And, a barrier oxide layer 58 is additionally formed on the surface of BN+ diffusion layer 54a as the result of thermal oxidation process- Here, the barrier oxide layer 58 and the linear oxide layer 57 are grown to have different thickness and more accurately, the barrier oxide layer 58 has a thickness thicker than that on the surface of the first and the second mask patterns 52a, 52b and the trench 56 since the growth speed of oxide layer is increased by BN+ ion implanted impurities. The linear oxide layer 57, formed on the surface of trench on the peripheral circuit region (B), operates to remove etching damage in the formation of trench 56, and to improve electrical properties of device by rounding the trench. An oxide layer 59 is deposited on the entire substrate 50 to fill up the trench on the peripheral circuit region (B).

Figure 5F:
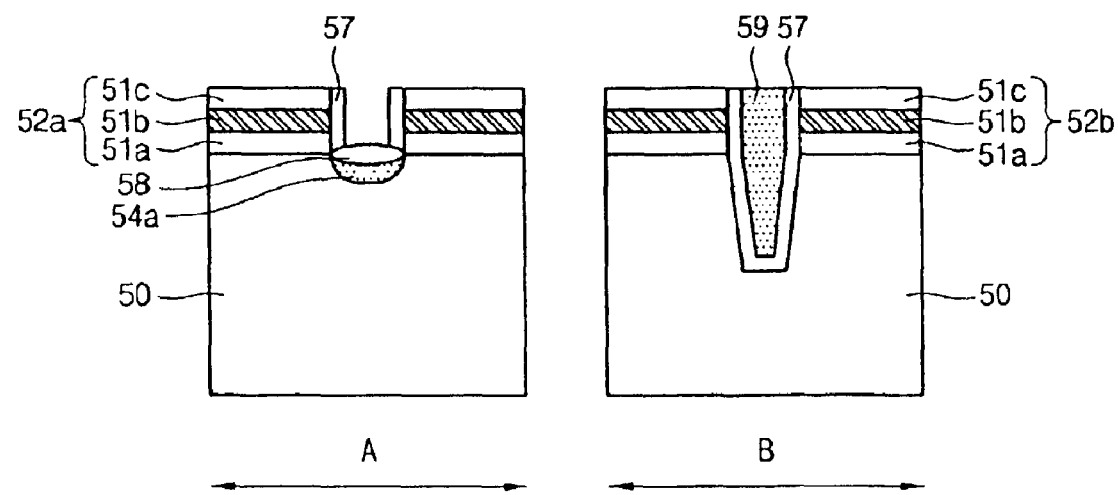

Referring to FIG. 5F, the oxide layer 59 and the linear oxide layer 57 are polished in accordance with a CMP process to expose the first and the second mask patterns 52a, 52b. The CMP of oxide layer is carried out in a state that the first mask pattern 52a is formed on the flat cell array region (A) and the second mask pattern 52b on the peripheral circuit region (B), thereby not generating irregular polish of oxide layer due to density difference between the flat cell array region (A) and the peripheral circuit region (B).

Figure 5G:
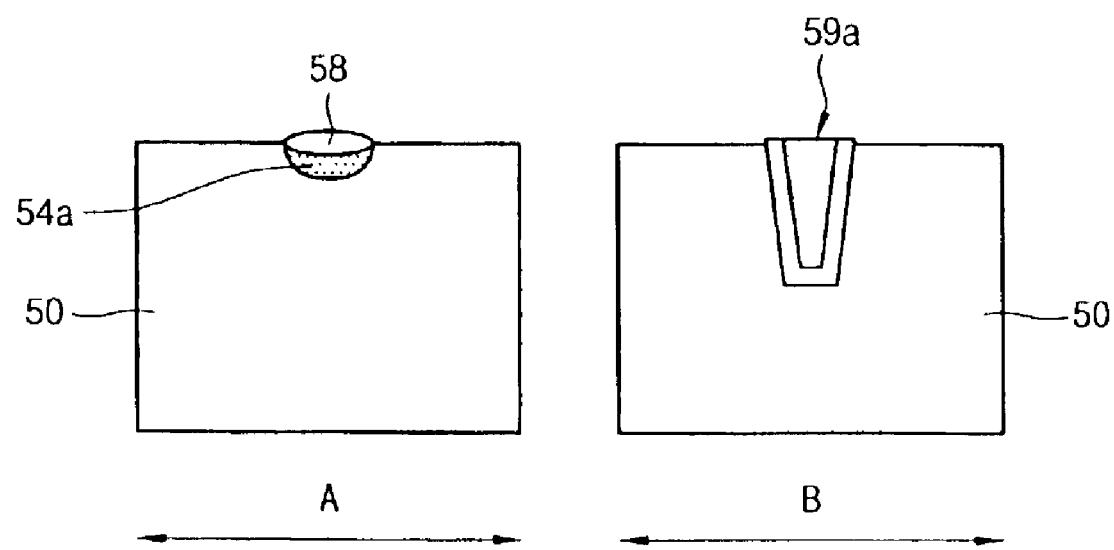

Referring to FIG. 5G, a trench type isolation layer 59a is formed on the peripheral circuit region (B) by removing the first and the second mask patterns in accordance with an etching process, thereby providing a BN+ diffusion layer 54a and a barrier oxide layer 58 on the substrate of flat cell array region (A) and a trench type isolation layer 59a on the substrate of peripheral circuit region (B). The BN+ diffusion layer formation process and the isolation layer formation process, that is a STI process, are performed at the same time. Therefore, it is possible to reduce the number of unit processes to LOGIC process.

Although it is not shown in the drawing, a LOGIC process including a gate process is performed on the resulting substrate having the BN+ diffusion layer 54a and the isolation layer 59a, thereby completing a mask ROM of flat cell structure.

Figure 6:
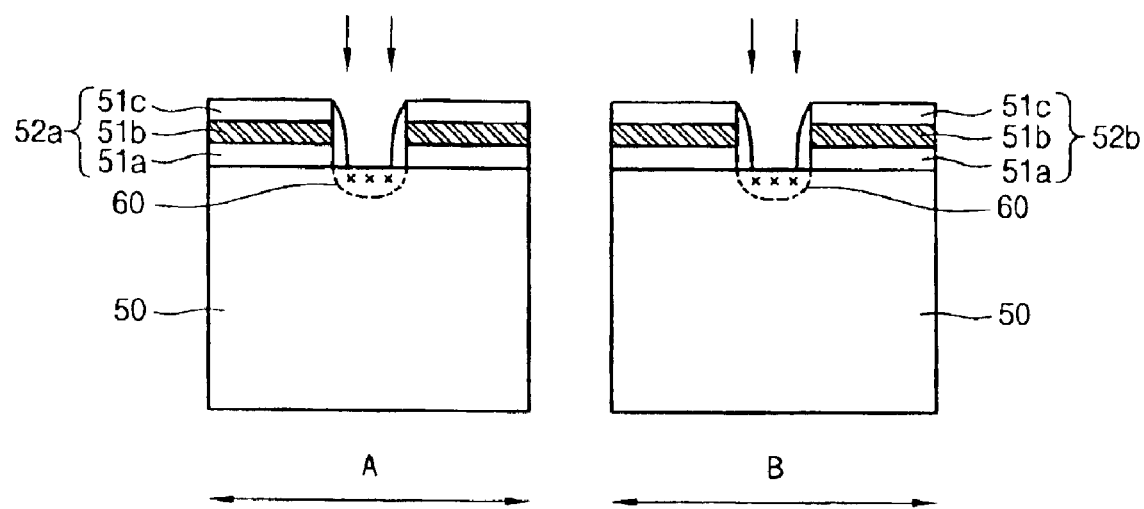
FIG. 6 is a sectional view showing a method for manufacturing a mask ROM of flat cell structure according to another embodiment of the present invention.

FIG. 6 is a sectional view showing a method for manufacturing a mask ROM of flat cell structure according to another embodiment of the present invention.

According to the embodiment, an insulating layer spacer, comprising TEOS oxide layers or nitride layers, is formed on sidewalls of the first mask pattern 52a for the formation of BN+ diffusion layer and the second mask pattern 52b for the formation of STI and, BN+ ion implantation is carried out by using the first and the second mask patterns 52a, 52b including the spacer as an ion implantation barrier. Therefore, the BN+ ion implantation region 60 has a size smaller than that in the convention method and thereby, the BN+ diffusion layer formed by later thermal oxidation process has a size smaller than that in the conventional method by twice of the width of spacer.

As a result, according to the present invention, the size of BN+ diffusion layer is reduced by forming a spacer on the sidewall of mask pattern before performing a BN+ ion implantation process and therefore, a flat cell is constructed to have a reduced size.

As described above, according to the present invention, it is possible to reduce the number of unit processes to LOGIC process by performing the BN+ diffusion layer process on the flat cell array region and the STI process on the peripheral circuit region at the same time, thereby reducing the manufacturing time and cost.

In the STI process, CMP of the oxide layer is performed in a state that BN+ diffusion layer and a mask pattern defining STI region are provided on the flat cell array region and the peripheral circuit region, respectively, thereby preventing irregular polish of oxide layer due to density difference of patterns on the flat cell array region and the peripheral circuit region.

Moreover, the size of BN+ diffusion layer is reduced by forming a spacer on the sidewall of mask patter defining the BN+ diffusion layer, thereby increasing the degree of integration.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing a mask ROM of flat cell structure comprising the steps of:

providing a semiconductor substrate having a flat cell array region and a peripheral circuit region;

forming a first and a second mask patterns exposing the substrate portions corresponding to a diffusion layer formation region of the flat cell array region and a device isolation layer of the peripheral circuit region;

ion-implanting an impurity in the exposed substrate portions;

forming a trench by etching the exposed substrate portion of the peripheral circuit region;

forming a linear oxide layer on the first and the second mask patterns and the surface of the trench, a diffusion layer on the flat cell array region, and a barrier oxide layer on the surface of diffusion layer in accordance with a thermal oxidation process;

depositing an oxide layer on the linear oxide layer to fill up the trench;

polishing the oxide layer to expose the surface of the first and second mask patterns; and forming a diffusion layer on the flat cell array region and a trench type isolation layer on the peripheral circuit region by removing the fist and the second mask patters.

2. The method for manufacturing a mask ROM of flat cell structure according to claim 1, wherein the first and the second mask patterns have a structure of multi-layered film comprising two or more layers.

3. The method for manufacturing a mask ROM of flat cell structure according to claim 2, wherein the first and the second mask patterns have structure of multi-layered film comprising a first insulating layer, a buffer layer and a second insulating layer.

4. The method for manufacturing a mask ROM of flat cell structure according to claim 1, wherein after the step of forming the first and the second mask patterns and before the stop of ion-implanting an impurity, further comprising a step of masking the peripheral circuit region so that the impurity ion implantation has a depth not deeper than that of the trench.

5. The method for manufacturing a mask ROM of flat cell structure according to claim 1, wherein the step of forming a trench is carried out after masking the flat cell array region.

6. The method for manufacturing a mask ROM of flat cell structure according to claim 1, wherein, the step of ion-implanting an impurity, conductive impurities opposite to the substrate are ion-implanted in high concentration.

7. The method for manufacturing a mask ROM of flat cell structure according to claim 1, wherein the itinerary oxide layer has a thickness of 50~400 Å.

8. The method for manufacturing a mask ROM of flat cell structure according to claim 1, wherein, after the step of forming the first and the second mask patterns and before the step of ion-implanting an impurity, further comprising a stop of forming a spacer on sidewalls of the first and the second mask patterns.

* * * * *